(12) United States Patent
Wang et al.

(10) Patent No.: US 7,370,416 B2
(45) Date of Patent: May 13, 2008

(54) METHOD OF MANUFACTURING AN INJECTOR PLATE

(75) Inventors: Jiun-Heng Wang, Tainan (TW); Yeong-Ching Chao, Tainan (TW); An-Hong Liu, Tainan (TW)

(73) Assignees: ChipMOS Technologies (Bermuda) Ltd., Hamilton (BM); ChipMOS Technologies Inc., Hsinchu (TW)

( * ) Notice: Subject to any disclaimer, the term of this patent is extended or adjusted under 35 U.S.C. 154(b) by 360 days.

(21) Appl. No.: 11/271,797

(22) Filed: Nov. 14, 2005

(65) Prior Publication Data

US 2006/0211273 A1    Sep. 21, 2006

(30) Foreign Application Priority Data

Mar. 17, 2005   (TW) .............................. 94108262 A

(51) Int. Cl.
*B41J 2/16*  (2006.01)
*C23C 14/34* (2006.01)

(52) U.S. Cl. ........................ 29/890.1; 29/896.6; 347/44; 347/47; 427/282; 205/75; 204/192.1; 204/192.11

(58) Field of Classification Search ............... 29/890.1, 29/896.6; 347/44, 45, 47; 205/75; 204/192.1, 204/192.11; 427/282
See application file for complete search history.

(56) References Cited

U.S. PATENT DOCUMENTS 4,675,083 A * 6/1987 Bearss et al. .............. 205/75 X

FOREIGN PATENT DOCUMENTS

JP       3-274160   * 12/1991   ................ 29/890.1
TW       410271       11/2000

* cited by examiner

*Primary Examiner*—A. Dexter Tugbang
(74) *Attorney, Agent, or Firm*—Troxell Law Office, PLLC

(57) ABSTRACT

A method of manufacturing an injector plate is provided where a wafer is provided and a release layer is disposed on the wafer. Then a photo resist is formed over the release layer. After photolithography processing, a plurality of plugs are formed from the photo resist. A titanium layer is sputtered on the release layer and on the plurality of plugs. The plugs are removed so that the titanium layer has a plurality of openings. An injector plate fabricated from this method has the characteristics of biocompatibility with a plurality of fine-pitch openings with uniform diameters.

9 Claims, 2 Drawing Sheets

METHOD OF MANUFACTURING AN INJECTOR PLATE

FIELD OF THE INVENTION

The present invention relates to a method of manufacturing an injector plate, and more particularly, to a method of manufacturing an injector plate made of titanium for biomedical applications, such as bio-filter for medicine, chemical, blood, cosmetic, DNA or piezo-filter for inhaler, humidifier, air refresher.

BACKGROUND OF THE INVENTION

Injector plates were used to spray liquids with the desired particle dimensions such as injector heads of ink jet printers or medicine sprayers. The dimension of the liquid particles was controlled by the openings through the injector plates to meet different application requirements.

Conventionally electroforming methods are implemented to manufacture an injector plate with fine pitch openings as revealed in R.O.C. patent publication No. 410,271. A photo resist is disposed on a stainless steel plate followed by photo processes, such as exposure and development, to create the desired pattern of the photo resist. After electroforming a metal layer on the stainless steel plate and stripping the photo resist, the metal layer has a plurality of openings to form an injector plate. The most common metal layer used is nickel-titanium alloy which cannot be implemented in bio-medical applications due to its active reactivity with human bodies. Moreover, the opening dimensions of the injector plates are very hard to control by electroforming or electroplating methods, therefore, the dimensions of the openings are not uniform so that the particle dimensions of the sprayed liquid can not be precisely controlled.

SUMMARY OF THE INVENTION

The main purpose of the present invention is to provide a method of fabricating an injector plate for bio-medical applications. A plurality of photo resist plugs are disposed on a release layer formed over a wafer, and then a titanium layer is sputtered on the release layer and the photo resist plugs. After removing the photo resist plugs, a plurality of openings are formed in the titanium layer. After removing the release layer, a bio-medical compatible injector plate with uniform and fine-pitch openings is fabricated.

The second purpose of the present invention is to provide a method of fabricating an injector plate. A release layer is a liquid photo resist spin-coated on a wafer on which an injector plate is fabricated. After the fabrication processes, the release layer is stripped to remove the injector plate from the wafer.

According to the present invention, a method of fabricating an injector plate having a first thickness, a wafer is provided with a fabrication surface where a release layer disposed over the fabrication surface. Then, a photo resist having a second thickness is disposed on the release layer, wherein the second thickness is thicker than the first thickness. After exposure and development, a plurality of plugs are formed in the photo resist. A titanium layer is sputtered on the exposed release layer and on the plugs. Finally, the plugs are stripped. An injector plate made of titanium with a plurality of uniform and fine-pitch openings is fabricated.

DETAIL DESCRIPTION OF THE INVENTION

Please refer to the attached drawings, the present invention will be described by means of embodiment(s) below.

Figure 1:
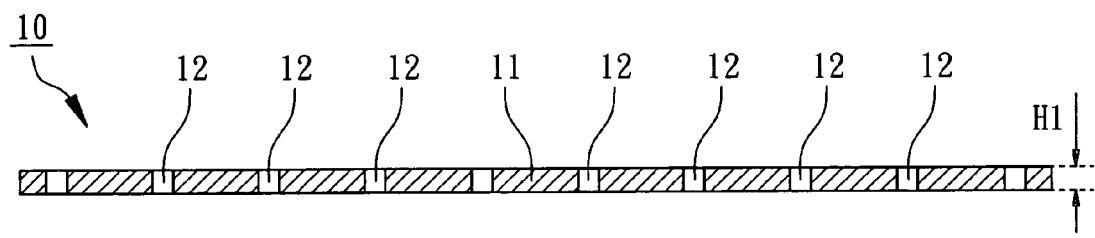
FIG. 1 is a cross-sectional view of an injector plate according to the embodiment of the present invention.

A method of fabricating an injector plate is illuminated by this embodiment according to the present invention. As shown in FIG. 1, the injector plate 10 has a first thickness H1 where H1 is between 25 um and 50 um. Moreover, the injector plate 10 includes a titanium layer 11 with a plurality of openings 12 which have the diameters between 3 um and 5 um.

Figure 2A:
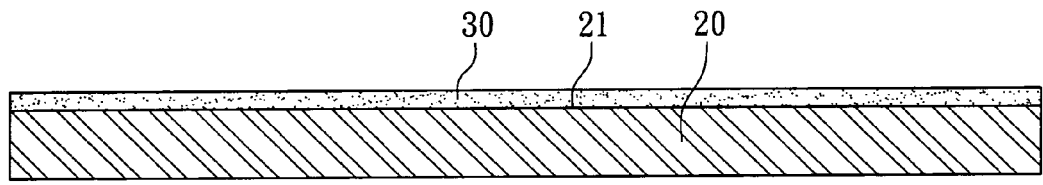
FIG. 2A to 2E are cross-sectional views of the injector plate during fabrication processes according to the embodiment of the present invention.

The cross-sectional views of the injector plate 10 during fabrication processes are shown from FIG. 2A to FIG. 2E. As shown in FIG. 2A, a wafer 20 is provided that can either be made of a semiconductor, or a blank silicon substrate, which has a fabrication surface 21. A release layer 30 is disposed over the fabrication surface 21 which may be a liquid photo resist accomplished by spin-coating. A soft bake process is followed to remove extra solvents in the release layer 30 to enhance the adhesions between the release layer 30 and the fabrication surface 21 of the wafer 20.

Figure 2B:
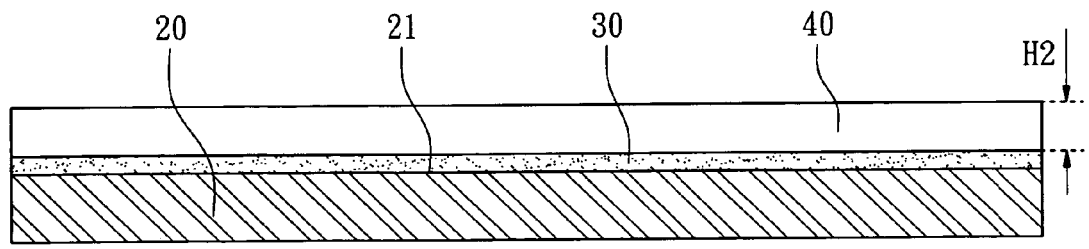
Figure 2C:
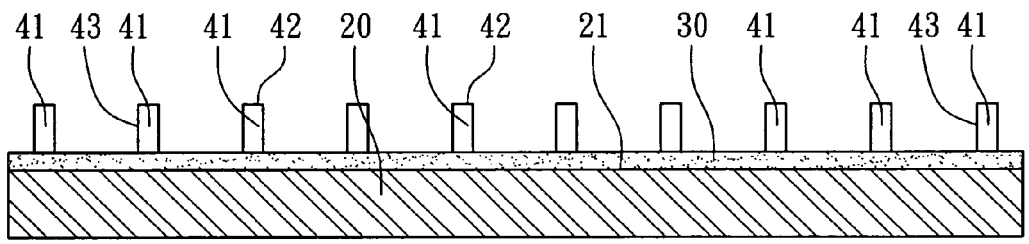

As shown in FIG. 2B, a photo resist 40 is disposed on the release layer 30, where the photo resist 40 has a second thickness H2 which is greater than the thickness H1 of the injector plate as shown in FIG. 1. Preferably, the photo resist 40 is a dry film or thick photo resist. Next, a photolithography process is performed to pattern the photo resist 40. As shown in FIG. 2C, a plurality of plugs 41 are formed by the photo resist 40 where the plugs 41 are densely and uniformly arranged in fine-pitch and the thickness of the plugs 41 is greater than the first thickness H1 of the injector plate 10. Moreover, the outer diameter of the plugs 41 is between 3 μm and 5 μm. Each plug 41 has a flat top surface 42 and a vertical sidewall 43, for example column-shaped, so that a sputtered titanium layer 11 in the following sputtering processes has discontinuous parts 13 on the flat top surfaces 42 above the wafer 20 for easy removal.

Figure 2D:
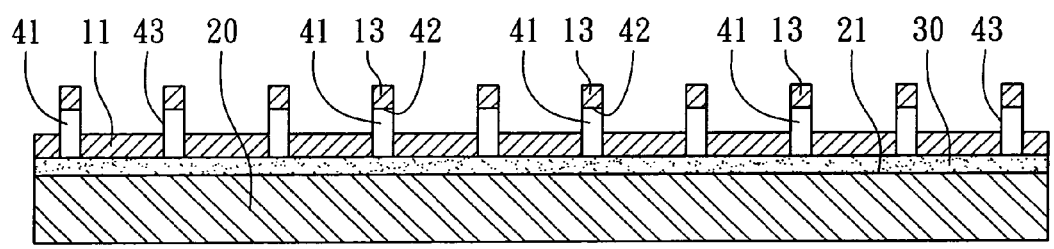
Figure 2E:
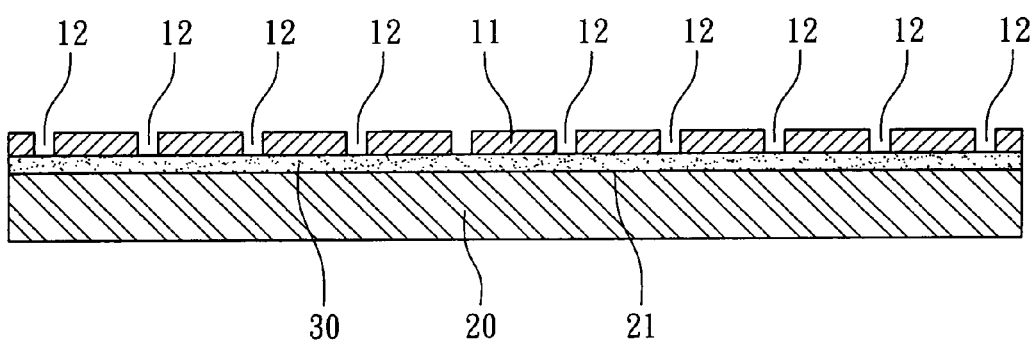

As shown in FIG. 2D, the titanium layer 11 is sputtered on the exposed release layer 30 and on the plugs 41 where the titanium layer 11 may be pure titanium metal or titanium alloy. The thickness of the titanium layer 11 is between 25 um and 50 um the same as H1. Plugs 41 along with the discontinuous parts 13 of the sputtered titanium 11 on the top surfaces 42 of the plugs 41 are removed by DI wafer or plasma etching. A plurality of openings 12 are formed through the remaining titanium layer 11 where the diameters of the openings 12 are between 3 um and 5 um.

Next, a wafer sawing process may be followed to saw the remaining titanium layer 11 into a plurality of individual pieces with the desired dimensions. After removing the release layer 30, the individual titanium layers 11 are stripped from the surface 21 of the wafer 20 to form Ti injector plate(s) 10 with a plurality of openings 12 (as shown in FIG. 1). Therefore, the fabricated injector plates 10 have the fine pitch openings with uniform diameters. Moreover, since the injector plates 10 are fabricated by pure titanium metal or its alloy which is biocompatible, therefore, allergy nor rejection will not happen when implementing in human bodies. The above description of embodiments of this invention is intended to be illustrative and not limiting. Other embodiments of this invention will be obvious to those skilled in the art in view of the above disclosure.

What is claimed is:

1. A method of manufacturing an injector plate, the injector plate having a first thickness, the method comprising the steps of:

providing a wafer, which has a fabrication surface;

forming a release layer over the fabrication surface of the wafer;

forming a photo resist on the release layer, which has a second thickness, where the second thickness is greater than the first thickness;

exposing and developing the photo resist to form a plurality of plugs;

sputtering a titanium layer on the exposed release layer and on the plugs; and removing the plugs so that the titanium layer has a plurality of openings therethrough.

2. The method of claim 1, wherein the release layer is a liquid photo resist formed by spin-coating.

3. The method of claim 1, wherein the thickness of the titanium layer is between 25 um and 50 um.

4. The method of claim 1, wherein the diameters of the openings are between 3 μm and 5 μm.

5. The method of claim 1, wherein the titanium layer is pure titanium or titanium alloy.

6. The method of claim 1, further comprising a wafer-sawing step.

7. The method of claim 6, further comprising a step of removing the release layer to remove the titanium layer from the sawed wafer.

8. The method of claim 1, wherein the wafer is made of a semiconductor.

9. The method of claim 1, wherein the wafer is a blank silicon substrate.

* * * * *